(12) United States Patent
Cha et al.

(10) Patent No.: US 7,782,676 B2
(45) Date of Patent: Aug. 24, 2010

(54) METHOD OF OPERATING A NONVOLATILE MEMORY DEVICE

(75) Inventors: Jae Won Cha, Seoul (KR); Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 139 days.

(21) Appl. No.: 12/164,008

(22) Filed: Jun. 28, 2008

(65) Prior Publication Data

US 2009/0290422 A1 Nov. 26, 2009

(30) Foreign Application Priority Data

May 20, 2008 (KR) ........................ 10-2008-0046598

(51) Int. Cl.
*G11C 16/06* (2006.01)

(52) U.S. Cl. ..................... 365/185.18; 365/185.19; 365/185.25; 365/185.26

(58) Field of Classification Search .................. None
See application file for complete search history.

(56) References Cited

U.S. PATENT DOCUMENTS 7,499,338 B2 * 3/2009 Ito .......................... 365/185.3
2007/0047366 A1 * 3/2007 Lee ....................... 365/230.03

FOREIGN PATENT DOCUMENTS

KR  1020050052807 A   6/2005
KR  1020060115992 A   11/2006

* cited by examiner

*Primary Examiner*—Hoai V Ho
*Assistant Examiner*—James G Norman
(74) *Attorney, Agent, or Firm*—Townsend and Townsend and Crew LLP

(57) ABSTRACT

A method of operating a nonvolatile memory device includes floating a drain select line, a source select line, a well, and a common source line of the nonvolatile memory device; precharging a program-inhibited bit line; and performing a program operation by applying a program voltage to a selected word line. The select lines and the well are floated to prevent the influence of a voltage applied to a bit line. Accordingly, degradation of the nonvolatile memory device can be prevented.

13 Claims, 5 Drawing Sheets dance with an embodiment of the present invention.

METHOD OF OPERATING A NONVOLATILE MEMORY DEVICE

CROSS-REFERENCES TO RELATED APPLICATIONS

The present application claims priority to Korean patent application number 10-2008-0046598, filed on May 20, 2008, which is incorporated by reference in its entirety.

BACKGROUND OF THE INVENTION

The present invention relates to an operation of a nonvolatile memory device and, more particularly, to a method of operating a nonvolatile memory device, which can prevent voltage applied to a bit line from having an effect on a drain select transistor.

A semiconductor memory device is a memory device that is able to store data and read stored data. Semiconductor memory devices include volatile memory, which loses stored data when power is off, and nonvolatile memory, which retains stored data although power is off. Flash memory is a nonvolatile memory device that electrically erases data of cells in a group, and has been widely used in computers, memory cards, and so on.

Flash memory is divided into a NOR type and a NAND type according to bit lines of a cell and the connection status of the bit lines. NOR type flash memory has a structure in which two or more cell transistors are connected in parallel to one bit line, and is configured to store data using the channel hot electron method and erase data using the Fowler-Nordheim (F-N) tunneling method. NAND type flash memory has a structure in which two or more cell transistors are connected in series to one bit line, and is configured to store and erase data using the F-N tunneling method. In general, NOR type flash memory is disadvantageous in regard to high integration because of high current consumption, but is advantageous in regard to high speed. NAND type flash memory is advantageous in regard to high integration because it uses a low cell current when compared with NOR type flash memory.

A method of programming the nonvolatile memory device employs an incremental step pulse programming (ISPP) method. In the ISPP method, after applying a program pulse, a program voltage is applied while increasing the program voltage to memory cells having a threshold voltage level lower than a verify voltage level by a certain step, but program-inhibiting memory cells having threshold voltage distributions higher than the verify voltage level.

In nonvolatile memory devices such as the flash memory device, when a program operation is performed, one of an even bit line and an odd bit line is selected for program and the other is applied with a power supply voltage for program inhibition.

If voltage applied to the bit line is high, a high voltage is applied to a drain select transistor, thereby increasing a bias difference. Consequently, the memory device quality can be degraded.

BRIEF SUMMARY OF THE INVENTION

The present invention is directed toward a method of operating a nonvolatile memory device, which can prevent voltage applied to a bit line from having an influence on a drain select transistor during operation of the nonvolatile memory device.

According to an aspect of the present invention, a method of operating a nonvolatile memory device includes floating a drain select line, a source select line, a well and a common source line, while a bit line is precharged when memory cells are programmed.

According to another aspect of the present invention, a method of operating a nonvolatile memory device includes floating a drain select line, a source select line, a well, and a common source line of the nonvolatile memory device; precharging a program-inhibited bit line; and performing a program operation by applying a program voltage to a selected word line.

The precharging of the bit line includes precharging the bit line when data to be programmed into a memory cell connected to the bit line is a first logic data, and not precharging the bit line when data to be programmed into a memory cell connected to the bit line is a second logic data.

The precharging of the bit line includes precharging unselected bit lines.

A program voltage applied to the word lines includes an incremental step pulse programming (ISPP) voltage.

DESCRIPTION OF SPECIFIC EMBODIMENT

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the present invention. The present invention is defined by the scope of the claims.

Figure 1A:
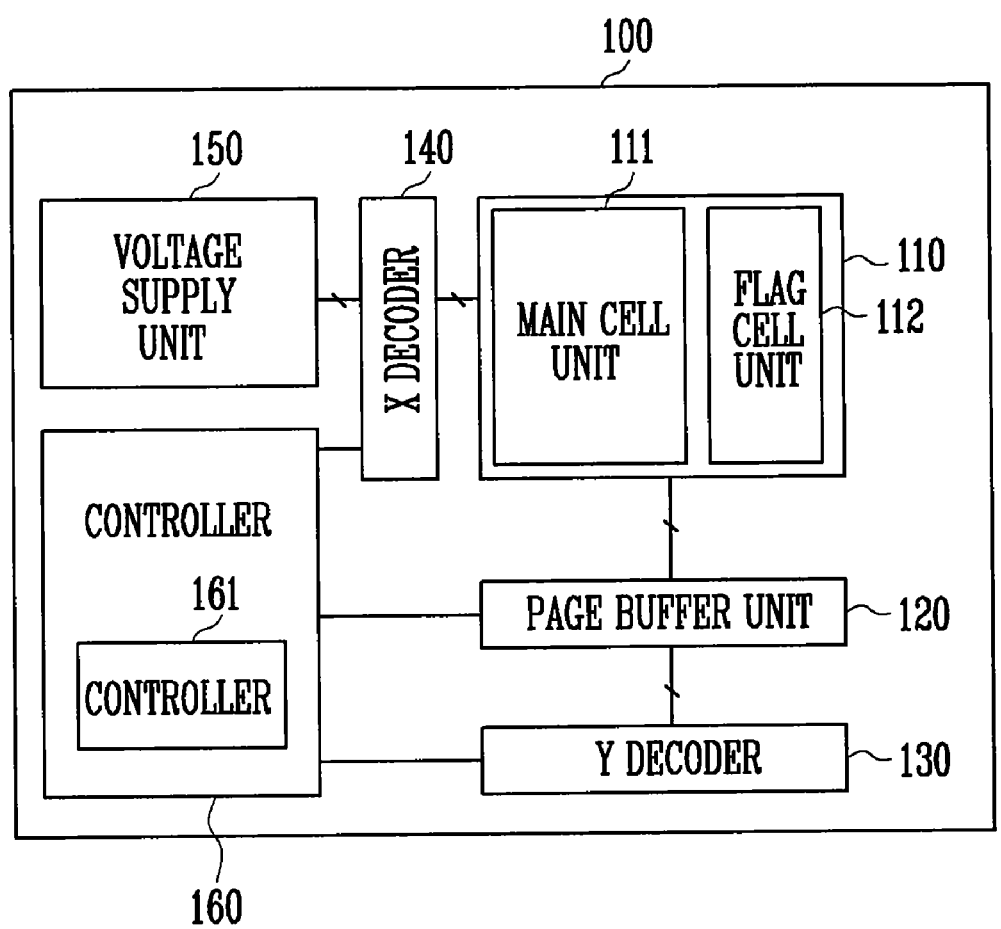
FIG. 1A is a block diagram of a flash memory device in accordance with an embodiment of the present invention.

FIG. 1A is a block diagram of a flash memory device in accordance with an embodiment of the present invention.

Referring to FIG. 1A, a flash memory device 100 in accordance with an embodiment of the present invention includes a memory cell array 110 in which memory cells for storing data are connected by word lines and bit lines.

The flash memory device 100 further includes a page buffer unit 120 coupled to a pair of the bit lines of the memory cell array 110. The page buffer unit 120 includes a plurality of page buffers for performing an operation of programming data into a memory cell and reading data stored in a memory cell.

The flash memory device 100 further includes a Y decoder 130 for selecting the page buffers of the page buffer unit 120 according to input address information and connecting a selected page buffer to an output path, and a X decoder 140 for selecting the word line of the memory cell array 110 according to an input address.

The flash memory device 100 further includes a voltage supply unit 150 for generating operating voltages for an operation of the flash memory device 100 and supplying generated operating voltages, and a controller 160 for controlling an operation of the flash memory device 100.

The memory cell array 110 includes a main cell unit 111 having main cells for data storage, and a flag cell unit 112 having flag cells for storing flag information. The flag information indicates program states of the memory cells of the main cell unit 111.

Each page buffer of the page buffer unit 120 is coupled to a pair of the bit lines, and temporarily stores data to be programmed into a memory cell or reads data stored in a memory cell and stores read data, under the control of the controller 160.

The voltage supply unit 150 generates a program voltage, a read voltage, a pass voltage, and so on, and provides the generated voltages for an operation. The controller 160 generates a control signal for an operation of the flash memory device 100.

The configuration of the memory cell array 110 is described in more detail below.

Figure 1B:
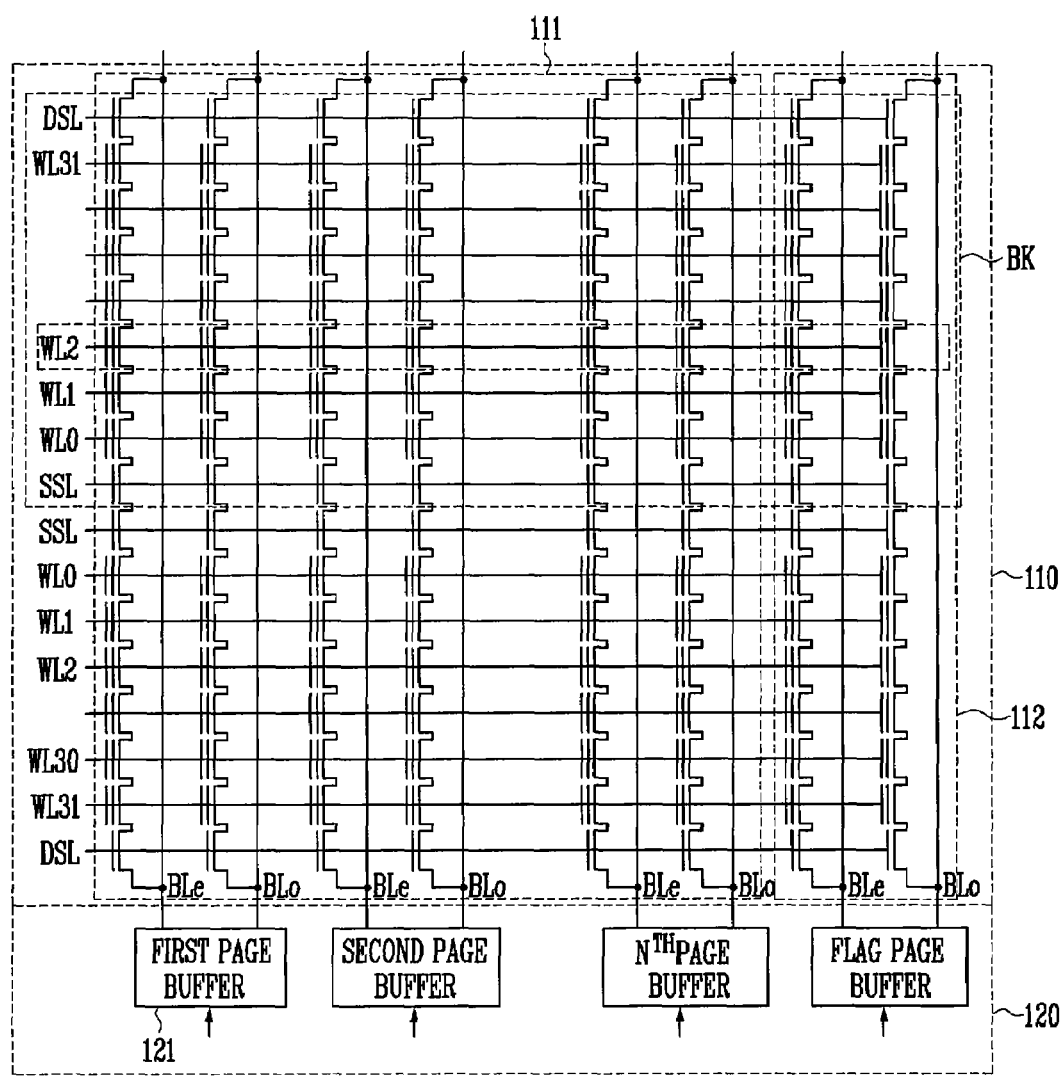
FIG. 1B is a partial detailed circuit diagram of FIG. 1A.

FIG. 1B is a partial detailed circuit diagram of FIG. 1A.

Referring to FIG. 1B, the memory cell array 110 includes a plurality of memory blocks BK. Each of the memory blocks BK includes the main cell unit 111 and the flag cell unit 112. The main cell unit 111 and the flag cell unit 112 are connected by the word lines, constituting a plurality of pages.

A pair of bit lines, that is, an even bit line BLe and an odd bit line BLo, are connected to one page buffer. The page buffer unit 120 includes first to $n^{th}$ page buffers 121 and at least one flag page buffer connected to the bit lines of the flag cell unit 112.

The first to $n^{th}$ page buffers 121 and the flag page buffer have the same circuit configuration. The first page buffer of the first to $n^{th}$ page buffers 121 is described below as a representative example.

Figure 1C:
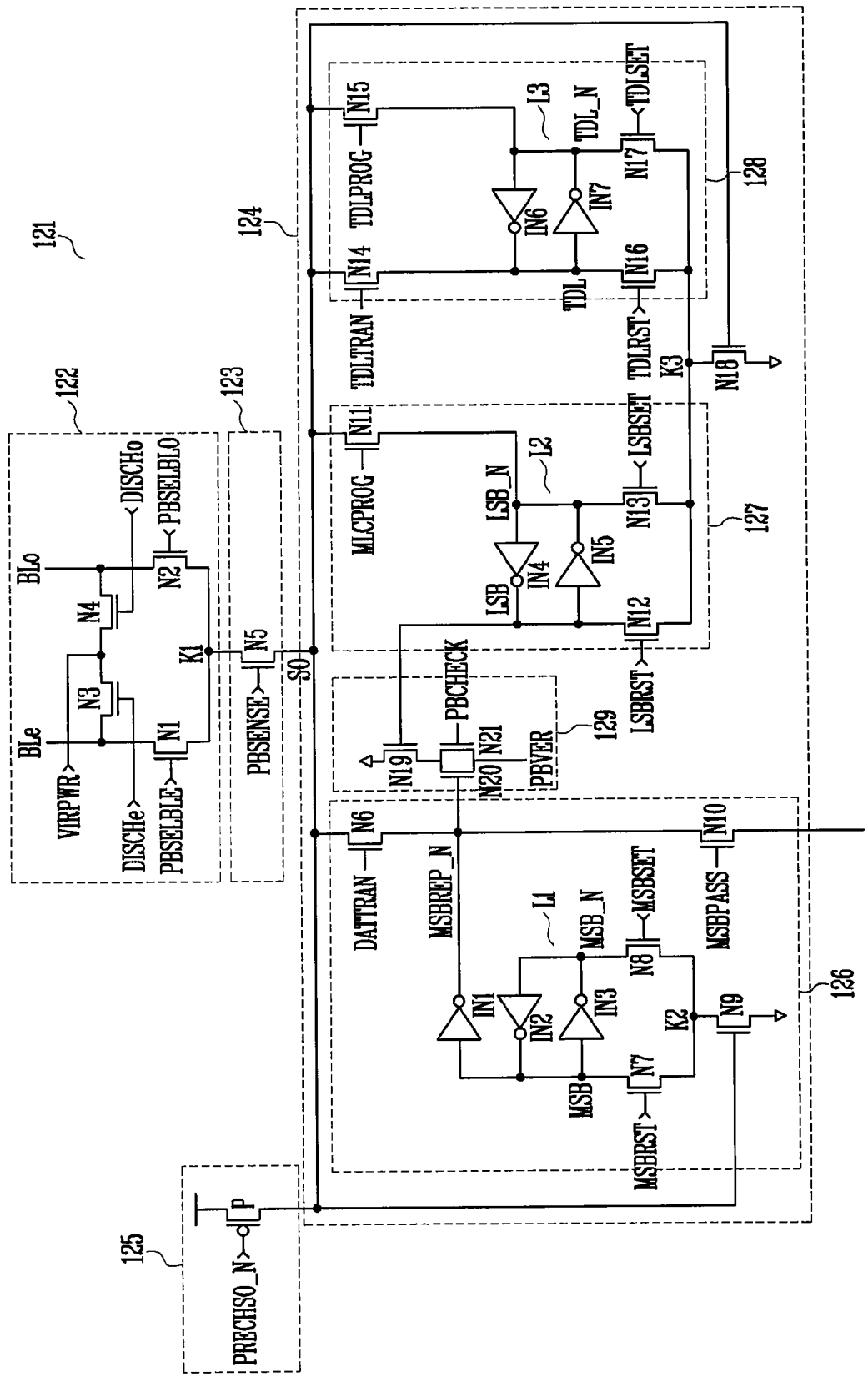
FIG. 1C is a circuit diagram of a page buffer shown in FIG. 1B.

FIG. 1C is a circuit diagram of the page buffer shown in FIG. 1B.

Referring to FIG. 1C, the first page buffer 121 includes a bit line select unit 122, a sensing unit 123, a latch unit 124, a precharge unit 125, and a verification unit 129.

The bit line select unit 122 selects the even bit line BLe and the odd bit line BLo. The sensing unit 123 senses a voltage of a bit line connected by the bit line select unit 122. A sensing result of the sensing unit 123 is reflected in a sensing node SO.

The precharge unit 125 precharges the sensing node SO. The latch unit 124 includes a plurality of latch circuits coupled to the sensing node SO. The latch unit 124 stores data from a memory cell in the latch circuit, or stores data for a program operation in the latch circuit, and then transfers the data to the sensing node SO according to a voltage level of the sensing node SO.

The latch unit 124 includes first to third latch circuit units 126 to 128. The verification unit 129 is connected between the first and second latch circuit units 126, 127 and outputs a verify signal for program verification.

The bit line select unit 122 includes first to fourth NMOS transistors N1 to N4. The sensing unit 123 includes a fifth NMOS transistor N5. The precharge unit 125 includes a PMOS transistor P.

The first latch circuit unit 126 includes sixth to tenth NMOS transistors N6 to N10 and first to third inverters IN1 to IN3. The second latch circuit unit 127 includes eleventh to thirteenth NMOS transistors N11 to N13 and fourth and fifth inverters IN4, IN5.

The third latch circuit unit 128 includes fourteenth to seventeenth NMOS transistors N14 to N17 and sixth and seventh inverters IN6, IN7. The verification unit 129 includes nineteenth to twenty-first NMOS transistors N19 to N21.

The first NMOS transistor N1 is connected between the even bit line BLe and a node K1. An even bit line select signal PBSELBLE is input to the gate of the first NMOS transistor N1.

The second NMOS transistor N2 is connected between the odd bit line BLo and the node K1. An odd bit line select signal PBSELBLO is input to the gate of the second NMOS transistor N2.

The third and fourth NMOS transistors N3, N4 are connected in series between the even bit line BLe and the odd bit line BLo. A virtual power VIRPWR is connected between the first and second NMOS transistors N1, N2. The virtual power VIRPWR supplies a power supply voltage Vcc for program inhibition or a voltage of 0V for discharging when a program operation is performed. Discharge control signals DISCHe, DISCHo are input to the gates of the third and fourth NMOS transistors N1, N2, respectively.

The fifth NMOS transistor N5 is connected between the node K1 and the sensing node SO. A control signal PBSENSE is applied to the gate of the fifth NMOS transistor N5. The fifth NMOS transistor N5 is turned on or off in response to voltage of a bit line applied thereto and a sensed voltage level of the control signal PBSENSE. When the fifth NMOS transistor N5 is turned on or off, a voltage level of the sensing node SO changes, so data stored in the latch unit 124 changes.

The PMOS transistor P of the precharge unit 125 is connected between a power supply voltage and the sensing node SO. A precharge control signal PRECHSO_N is input to the gate of the PMOS transistor P.

The sixth NMOS transistor N6 is connected between the sensing node SO and a node MSBREP_N. A first data transmission signal DATTRAN is input to the gate of the sixth NMOS transistor N6.

The first inverter IN1 inverts data of a node MSB and outputs inverted data to the node MSBREP_N. The second and third inverters IN2, IN3 are connected between the node MSB and a node MSB_N in a latch circuit form, thereby constituting a first latch L1.

The seventh NMOS transistor N7 is connected between the node MSB and a node K2. The eighth NMOS transistor N8 is connected between the node MSB_N and the node K2. A first reset signal MSBRST and a first set signal MSBSET are input to the gates of the seventh and eighth NMOS transistors N7, N8, respectively.

Further, the ninth NMOS transistor N9 is connected between the node K2 and a ground node. The gate of the ninth NMOS transistor N9 is connected to the sensing node SO. The tenth NMOS transistor N10 is connected between the node MSBREP_N and an output terminal. A data output control signal MSBPASS is input to the gate of the tenth NMOS transistor N10.

The eleventh NMOS transistor N11 is connected between the sensing node SO and a node LSB_N. A second data transmission signal MLCPROG is input to the gate of the eleventh NMOS transistor N9. The fourth and fifth inverters IN4, IN5 are connected between a node LSB and the node LSB_N in a latch circuit form, thereby constituting a second latch L2.

The twelfth NMOS transistor N12 is connected between the node LSB and a node K3. The thirteenth NMOS transistor N13 is connected between the node LSB_N and the node K3. A second reset signal LSBRST and a second set signal LSBSET are input to the gates of the twelfth and thirteenth NMOS transistors N12, N13, respectively.

The fourteenth NMOS transistor N14 is connected between the sensing node SO and a node TDL. The fifteenth NMOS transistor N15 is connected between the sensing node SO and a node TDL_N. A third data signal TDLTRAN and a fourth data transmission signal TDLPROG are input to the gates of the fourteenth and fifteenth NMOS transistors N14, N15, respectively.

The sixth and seventh inverters IN6, IN7 are connected between the node TDL and the node TDL_N in a latch circuit form, constituting a third latch L3.

The sixteenth NMOS transistor N16 is connected between the node TDL and the node K3. The seventeenth NMOS transistor N17 is connected between the node TDL_N and the node K3. A third reset signal TDLRST and a third set signal TDLSET are input to the gates of the sixteenth and seventeenth NMOS transistors N16, N17, respectively.

The eighteenth NMOS transistor N18 is connected between the node K3 and a ground node. The sensing node SO is connected to the gate of the eighteenth NMOS transistor N18.

The twentieth and twenty-first NMOS transistors N20, N21 are connected between the nineteenth NMOS transistor N19 and a verify signal output node PBVER. The gate of the twentieth NMOS transistor N20 is connected to the node MSBREP_N. A page buffer check signal PBCHECK is connected to the gate of the twenty-first NMOS transistor N21.

The nineteenth NMOS transistor N19 is connected between a ground node and the twentieth and twenty-first NMOS transistors N20, N21. The node LSB is connected to the gate of the nineteenth NMOS transistor N19.

The flash memory device constructed as shown in FIGS. 1A and 1B performs program inhibition by precharging bit lines unselected for a program operation when a general program operation is performed.

That is, in FIG. 1C, in order to program-inhibit the even bit line BLe, a high voltage Vmax is applied to the virtual power VIRPWR and a power supply voltage is applied to the discharge control signal DISCHe, thereby turning on the third NMOS transistor N3.

When the third NMOS transistor N3 is turned on, the even bit line BLe is precharged to the virtual power VIRPWR, and the even bit line BLe is precharged to a voltage (Vmax−Vth) in which the threshold voltage (Vth) of the third NMOS transistor N3 is subtracted from the virtual power VIRPWR.

A ground voltage GND is input to a drain select line DSL of the memory cell array 110 in order to turn off a drain select transistor DST, and the ground voltage GND is also input to a well. The ground voltage GND is also applied to a source select line SSL in order to turn off a source select transistor SST. The power supply voltage is applied to a common source line SL.

If a voltage level of the virtual power VIRPWR rises in the process of turning off the drain select transistor DST and the source select transistor SST and precharging the bit line as described above, a high voltage is applied to the drain side of the drain select transistor DST and no voltage is applied to the source side of the drain select transistor DST.

Figure 2:
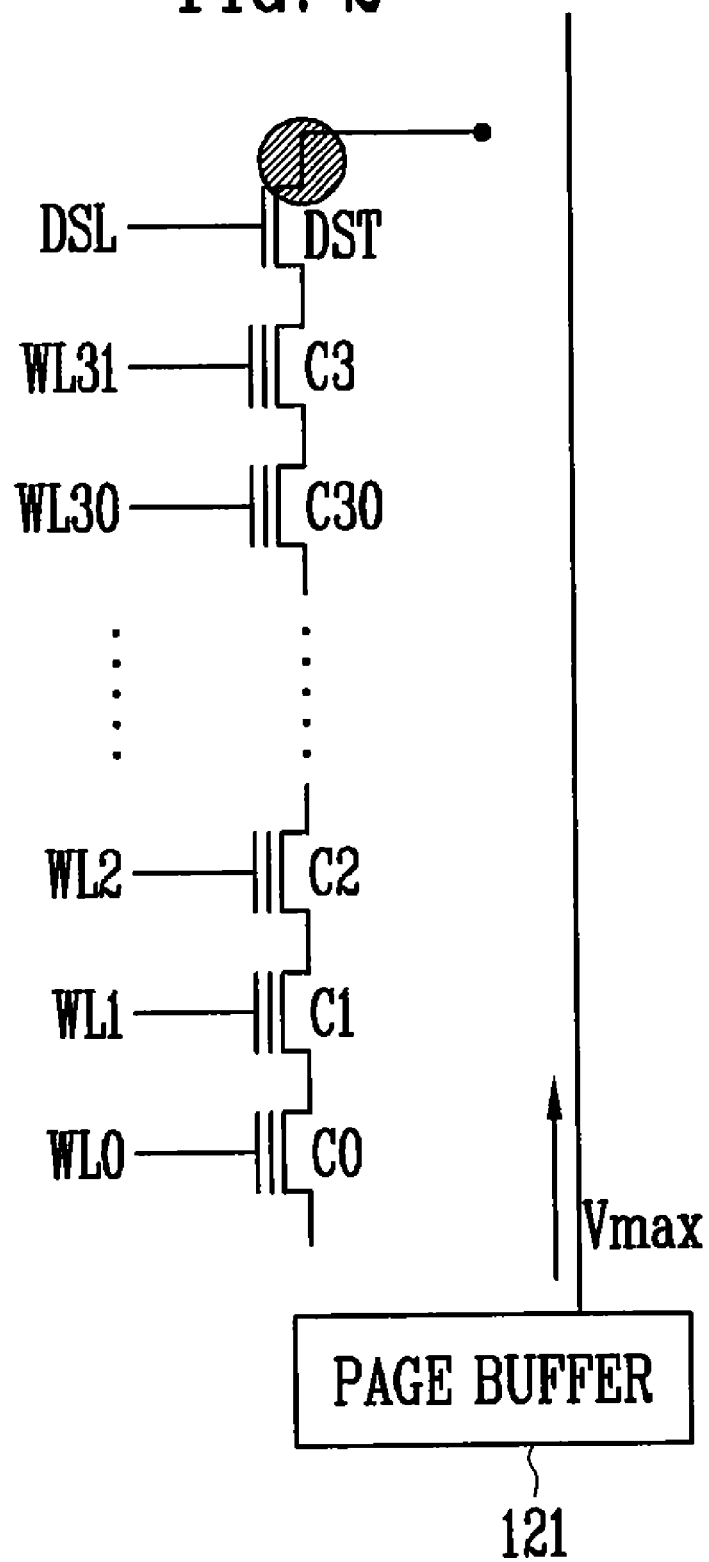
FIG. 2 is a circuit diagram of a cell string when precharging a bit line.

FIG. 2 is a circuit diagram of a cell string when precharging a bit line.

Referring to FIG. 2, when the precharge voltage Vmax is input through a bit line, a large difference occurs between a drain-side voltage and a source-side voltage of the drain select transistor DST. Thus, the drain select transistor DST may have a malfunction or an error.

Accordingly, voltages are applied as follows.

Figure 3:
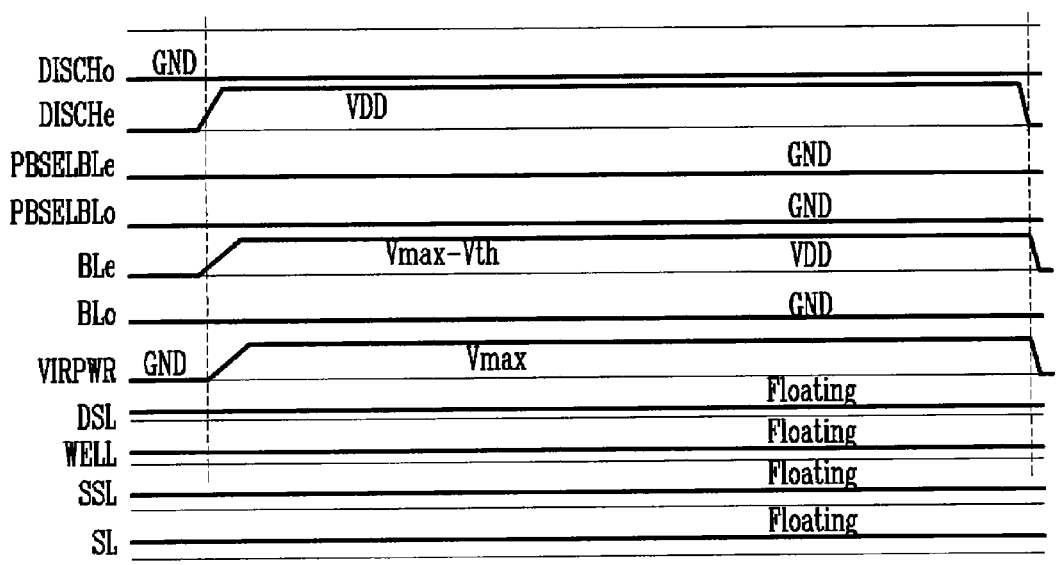
FIG. 3 is a timing diagram of voltages applied in accordance with an embodiment of the present invention.

FIG. 3 is a timing diagram of voltages applied in accordance with an embodiment of the present invention.

FIG. 3 shows the supply of voltages when a bit line for program inhibition is the even bit line BLe. The precharge voltage Vmax is applied to the virtual power VIRPWR and a power supply voltage VDD is applied to the discharge control signal DISCHe, turning on the third NMOS transistor N3.

When the third NMOS transistor N3 is turned on, the virtual power VIRPWR is input to the even bit line BLe. The even bit line BLe is precharged to a voltage in which the threshold voltage (Vth) of the third NMOS transistor N3 is subtracted from the precharge voltage Vmax.

The drain select line DSL, the well, the source select line SSL, and the common source line SL are all floated.

When the drain select line DSL, the well, the source select line SSL, and the common source line SL are floated, a voltage applied to the gate of the drain select transistor DST is not 0V, but becomes a certain bias voltage. Accordingly, the drain select transistor DST is influenced by the voltage (Vmax−Vth) precharged by the bit line, so that a degradation phenomenon does not occur.

As described above, according to the method of operating a nonvolatile memory device in accordance with the present invention, in order to prevent the influence of a voltage applied to a bit line, general transistors, a well, etc. of a memory cell array are floated. Accordingly, degradation of a nonvolatile memory device can be prevented.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of operating a nonvolatile memory device, the method comprising:
    precharging a bit line when memory cells are programmed; and
    floating a drain select line, a source select line, a well and a common source line during the precharging of the bit line.

2. The method of claim 1, further comprising:
    performing a program operation by applying a program voltage to a selected word line.

3. The method of claim 2, wherein the program voltage is an incremental step pulse programming (ISPP) voltage.

4. The method of claim 1, wherein the precharging of the bit line comprises:
    precharging the bit line when data to be programmed into a memory cell connected to the bit line is a first logic data, and
    not precharging the bit line when data to be programmed into a memory cell connected to the bit line is a second logic data.

5. The method of claim 1, wherein the precharging of the bit line includes precharging unselected bit lines.

6. A method of operating a nonvolatile memory device, the method comprising:
    floating a drain select line, a source select line, a well, and a common source line of the nonvolatile memory device;
    precharging a program-inhibited bit line; and
    performing a program operation by applying a program voltage to a selected word line.

7. The method of claim 6, wherein the precharging of the bit line comprises:
    precharging the bit line when data to be programmed into a memory cell connected to the bit line is a first logic data, and
    not precharging the bit line when data to be programmed into the memory cell connected to the bit line is a second logic data.

8. The method of claim 7, wherein the precharging of the bit line includes precharging unselected bit lines.

9. The method of claim 6, wherein the program voltage comprises an incremental step pulse programming (ISPP) voltage.

10. A method of operating a nonvolatile memory device, the method comprising:
- floating a drain select line of a drain select transistor, a source select line, a well, and a common source line of the nonvolatile memory device;
- precharging a program-inhibited bit line, wherein the floating state of the drain select line, the source select line, the well, and the common source line prevents the precharged program-inhibited bit line from affecting a drain select transistor of the nonvolatile memory device; and
- performing a program operation by applying a program voltage to a selected word line.

11. The method of claim 10, wherein the precharging of the bit line comprises:
- precharging the bit line when data to be programmed into a memory cell connected to the bit line is a first logic data, and
- not precharging the bit line when data to be programmed into a memory cell connected to the bit line is a second logic data.

12. The method of claim 10, wherein the precharging of the bit line includes precharging unselected bit lines.

13. The method of claim 10, wherein the program voltage comprises an incremental step pulse programming (ISPP) voltage.

* * * * *